United States Patent [19]

Takesue et al.

[11] Patent Number: 4,837,787
[45] Date of Patent: Jun. 6, 1989

[54] SEMICONDUCTOR LASER DEVICE WITH LIGHT EMISSION INHIBITING MEANS

[75] Inventors: Toshihiro Takesue; Takashi Murahashi; Toshihiko Nakazawa, all of Hachioji, Japan

[73] Assignee: Konishiroku Photo Industry Co., Ltd., Tokyo, Japan

[21] Appl. No.: 54,418

[22] Filed: May 26, 1987

[30] Foreign Application Priority Data

Jun. 4, 1986 [JP] Japan ............................... 61-129381
Jun. 4, 1986 [JP] Japan ............................... 61-129382
Jun. 4, 1986 [JP] Japan ............................... 61-129383
Jun. 4, 1986 [JP] Japan ............................... 61-129384
Jul. 9, 1986 [JP] Japan ............................... 61-161461

[51] Int. Cl.$^4$ .............................................. H01S 3/10
[52] U.S. Cl. ......................................... 372/29; 372/31
[58] Field of Search ..................... 372/29, 38, 31, 32

[56] References Cited

U.S. PATENT DOCUMENTS 4,592,057  5/1986  Comerford ............................ 372/38
4,612,671  9/1986  Giles ..................................... 372/38
4,618,958  10/1986  Shibata et al. ........................ 372/38

Primary Examiner—James W. Davie
Attorney, Agent, or Firm—Frishauf, Holtz, Goodman & Woodward

[57] ABSTRACT

A seimconductor laser device wherein the quantity of light emitted from a semiconductor laser is monitored by a light quantity monitor circuit, and the output of the monitor circuit is compared by a comparator circuit with a reference voltage. An emission inhibiting device inhibits the semiconductor laser from emitting light in accordance with the output of the comparator circuit. The emission inhibiting device is arranged to inhibit the supply of an optical modulation signal to the semiconductor laser, or it comprises a current source for driving the semiconductor laser, the output of the current source being reduced when the emission of light from the laser is to be inhibited.

17 Claims, 10 Drawing Sheets

A  VOLTAGE SIGNAL CORRESPONDING TO LIGHT QUANTITY

B  OUTPUT OF COMPARATOR

C  EMISSION INHIBIT SIGNAL (OUTPUT OF LATCH)

NORMAL OPERATION — EMISSION INHIBITION

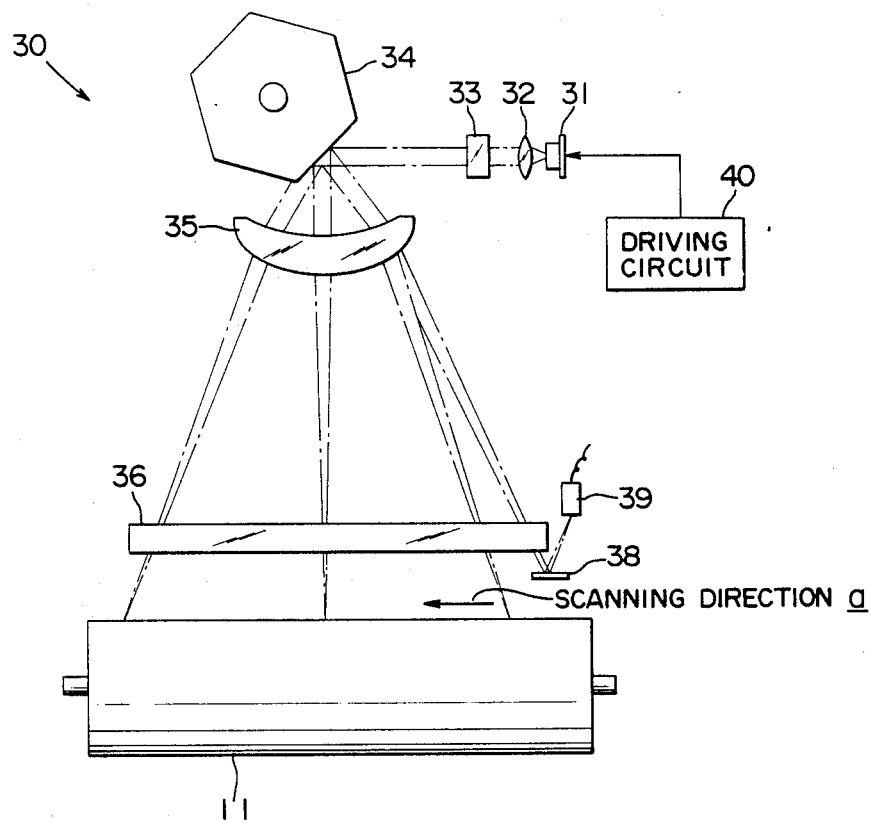
PRIOR ART FIG. 7
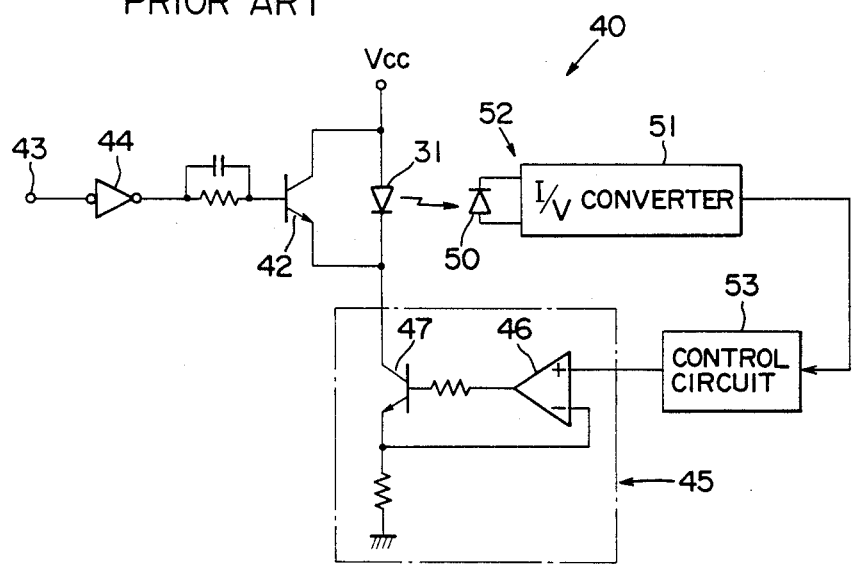
PRIOR ART FIG. 8

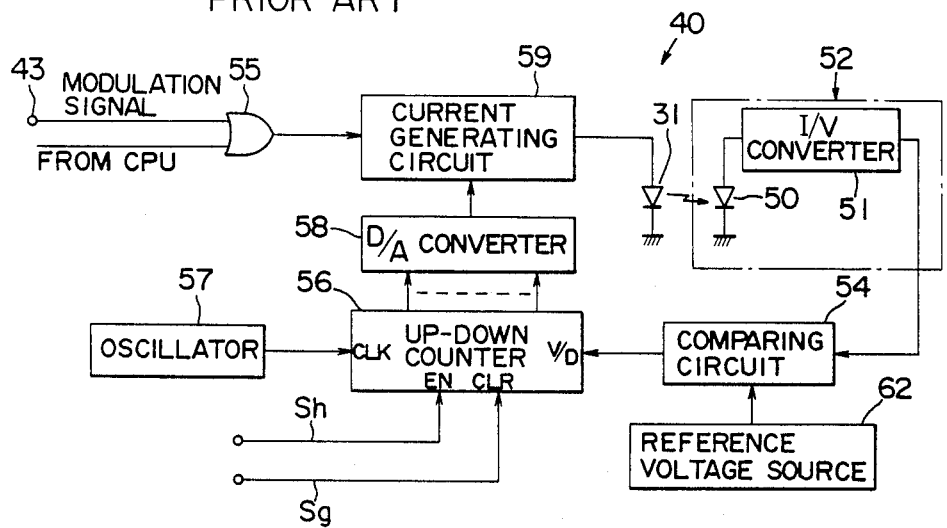
PRIOR ART FIG. 9
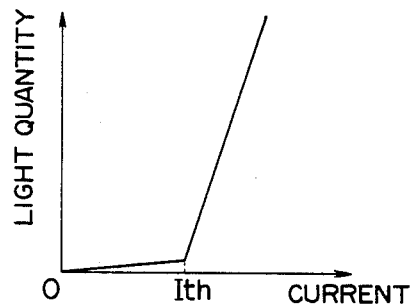
PRIOR ART FIG. 10
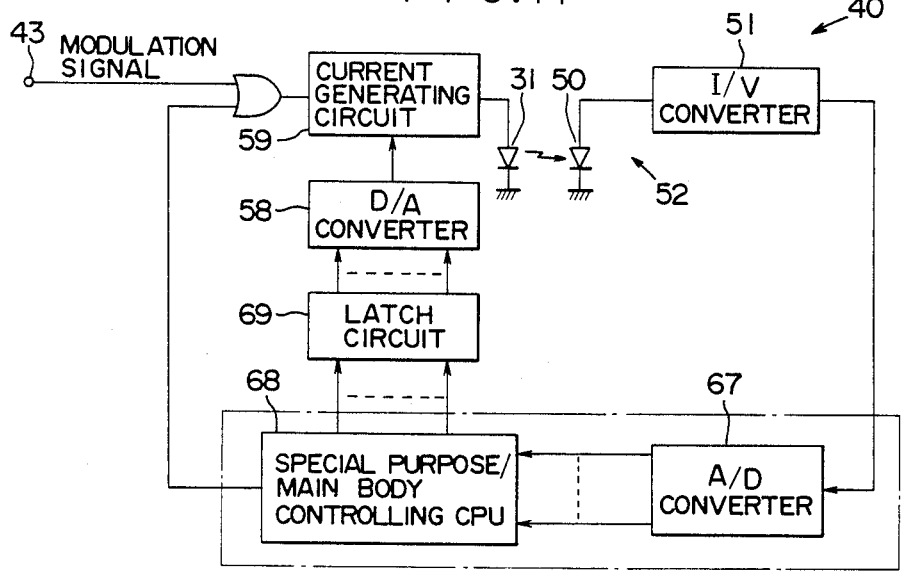
FIG. 11

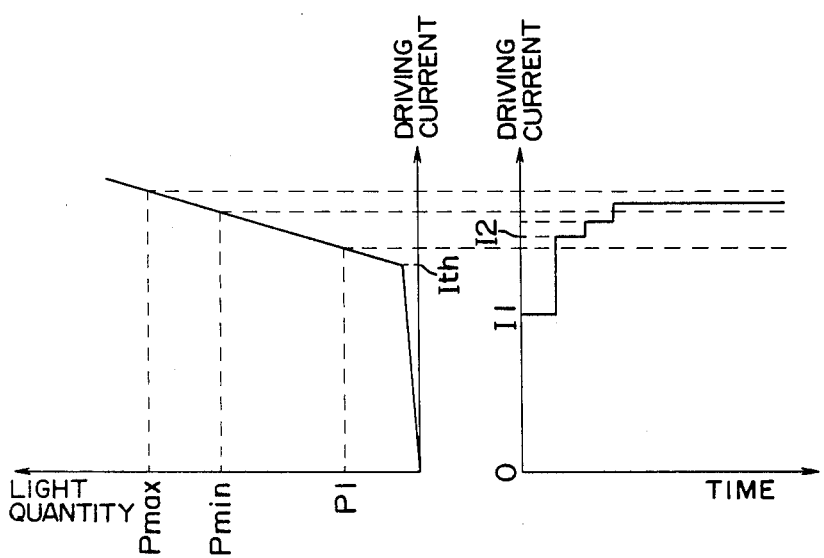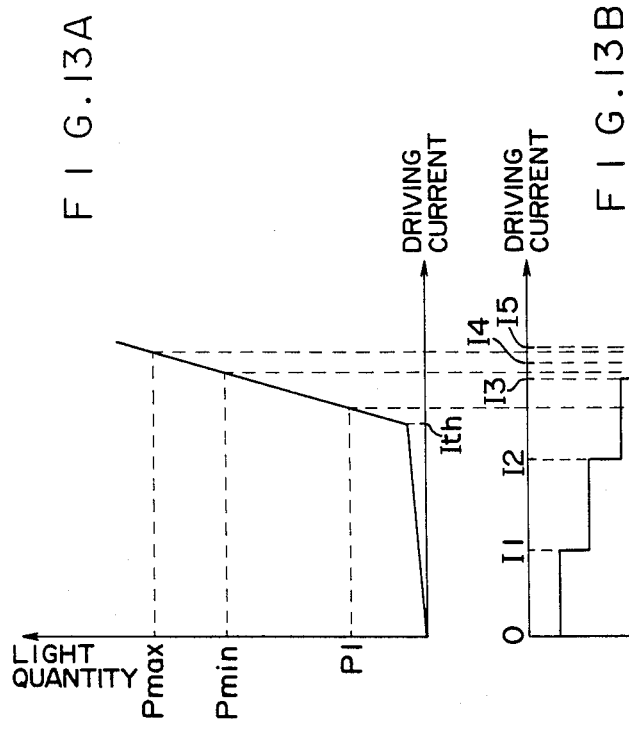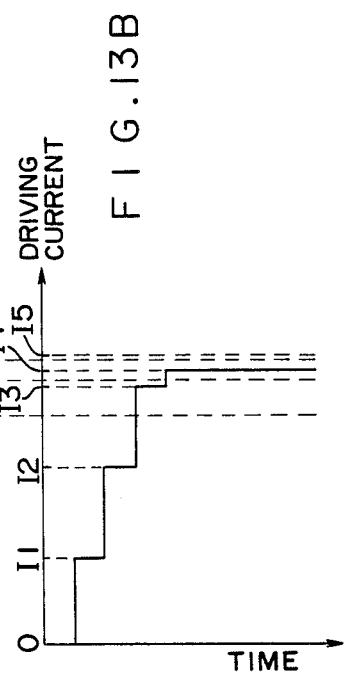
FIG. 13A FIG. 13B
FIG. 12A FIG. 12B

F I G. 15
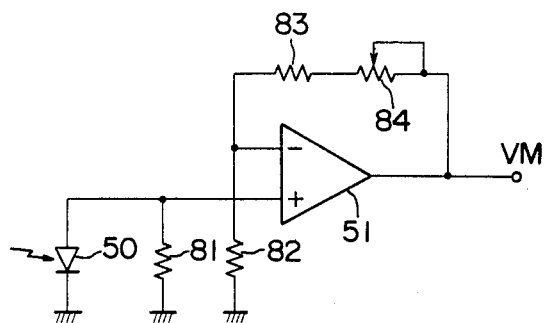
F I G. 16
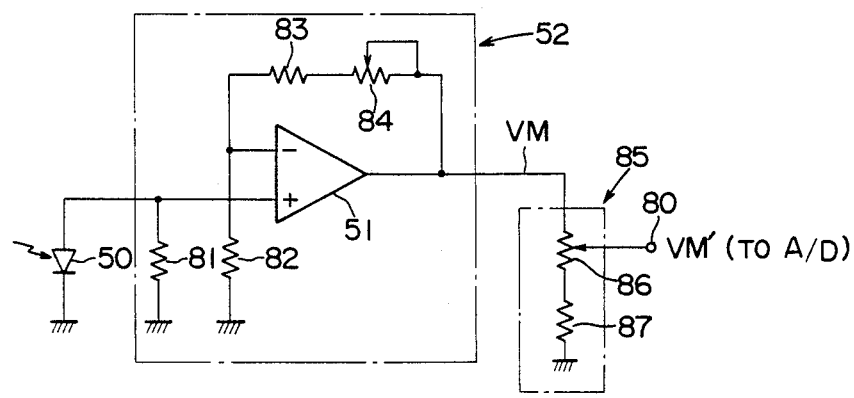
F I G. 17
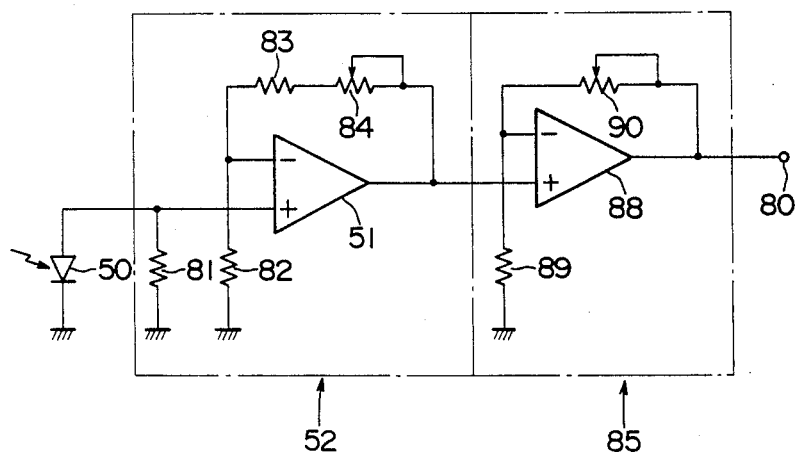

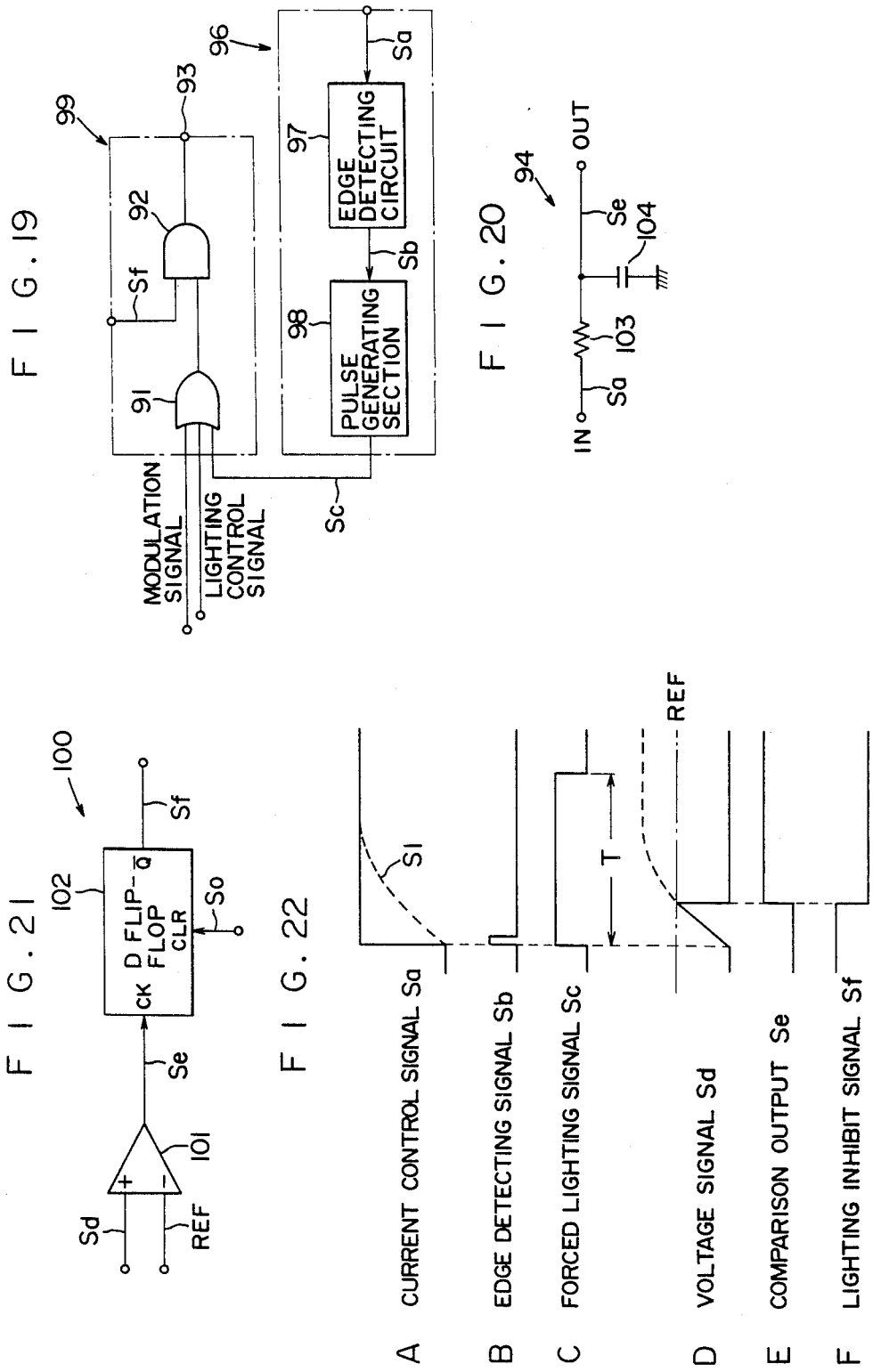

SEMICONDUCTOR LASER DEVICE WITH LIGHT EMISSION INHIBITING MEANS

BACKGROUND OF THE INVENTION

1. Field of the Invention

The present invention relates to a semiconductor laser device which may suitably be applied to an electrophotographic color reproducing machine, a laser printer or the like.

2. Description of the Prior Art

One type of electrophotographic color reproducing machine or other similar means employs a semiconductor laser as a means for forming an electrostatic latent image on a photosensitive image retainer using an image signal corresponding to a document.

FIG. 6 shows one example of a simple type color reproducing machine 10. This machine is arranged to record a color image of a color document by separating color data concerning the document into a number of different kinds of color data which is on the order of three. As color data items which are to be separated from each other, three colors, that is, black BK, red R and blue B, are shown by way of example.

In FIG. 6, the reference numeral 11 denotes an image retainer in the shape of a drum which has a photoconductive photosensitive surface layer such as selenium formed on its surface so that an electrostatic image (electrostatic latent image) corresponding to an optical image can be formed on the surface of the image retainer 11.

Members which will be explained below are successively disposed along the peripheral surface of the image retainer 11 in the hereinafter mentioned order in the direction of rotation of the image retainer 11.

The surface of the image retainer 11 is electrically charged uniformly by the operation of a charging device 12. The charged surface of the image retainer 11 is exposed to light (denoted by the numeral 14) to form an optical image based on each color separation image.

The electrostatic latent image formed on the surface of the image retainer 11 by the exposure is developed by means of predetermined developing devices. A number of developing devices which corresponds to the number of color separation images are disposed adjacent image retainer 11. In this example, a developing device 15 charged with a developer for red toner, a developing device 16 charged with a developer for blue toner and a developing device 17 charged with a developer for black toner are successively disposed in that order in the direction of rotation of the image retainer 11 in such a manner that these developing devices face the surface of the image retainer 11.

The developing devices 15 to 17 are sequentially selected in synchronism with the rotation of the image retainer 11, and when, for example, the developing device 17 is selected, a black color separation image is developed.

A pre-transfer charging device 19 and a pre-transfer exposing lamp 20 are provided at the downstream side of the developing device 17 in terms of the direction of rotation of the image retainer 11 to facilitate transfer of a color image to a recording medium P. However, the pre-transfer charging device 19 and the pre-transfer exposing lamp 20 may be provided according to need.

The color image developed on the surface of the image retainer 11 is transferred to the recording medium P by the operation of a transfer device 21.

The recording medium P having the transferred color image is subjected to a fixing process carried out by a fixing device 22 which is provided at the downstream side of the transfer device 21, and the recording medium P is then discharged.

A charge eliminating device 23 which may be employed according to need comprises of either one or both of a charge eliminating lamp and a charge eliminating corona discharger.

A cleaning device 24 comprises of a cleaning blade, a fur brush, etc. and is adapted to remove with these components remaining toner attached to the surface of the drum constituting the image retainer 11 after the color image has been transferred therefrom.

As the above-described charging device 12, it is possible to employ, for example, a Scorotron Corona discharger. This type of charging device is less affected by the previous charge and therefore is capable of giving a stable electric charge to the surface of the image retainer 11.

As the light for exposure, light which is obtained from a laser beam scanner is used in this example.

In the case of a laser beam scanner, it is advantageously possible to use a compact and inexpensive semiconductor laser as a light source of the image recording machine and also to record a clear color image.

An image exposing means which is shown in FIG. 7 illustrates one example of the laser beam scanner 30.

The laser beam scanner 30 has a semiconductor laser 31 which is subjected to optical modulation on the basis of color separation images (e.g., binary data).

The laser beam which is emitted from the laser 31 is passed through a collimator lens 32 and a cylindrical lens 33 and made incident on a mirror scanner 34 which comprises a rotary polygon mirror.

The laser beam is deflected by the mirror scanner 34 and applied to the surface of the image retainer 11 through an f-$\theta$ lens 35 and a cylindrical lens 36 for image formation.

The mirror scanner 34 causes the laser beam to scan across the surface of the image retainer 11 at a constant speed and in a predetermined direction a, and exposure in correspondence with each color separation image is effected by this scanning.

It should be noted that the reference numeral 39 denotes a photosensor which receives the laser beam reflected from a mirror 38 to obtain an index signal which indicates the start of a laser beam scanning operation, and image data for one line is written on the basis of this index signal.

Employment of the laser beam scanner 30 enables facilitation of an electrostatic image forming operation in which an electrostatic image is formed while being displaced for each color separation image, and it is therefore possible to form a clear color image.

FIG. 8 is a circuit diagram of one example of a laser driving circuit 40.

The laser driving circuit 40 is provided with a circuit for driving a laser with a modulation signal, together with a light quantity stabilizing circuit for stabilizing the quantity of light emitted from the laser.

In FIG. 8, a current bypass transistor 42 is connected in parallel to the laser 31, and a modulation signal based on image data supplied to a terminal 43 is supplied to the transistor 42 through a driver 44. Thus, the transistor 42 is ON/OFF controlled in response to the modulation signal, and the supply of the current to the laser 31 is thereby controlled.

A variable constant-current circuit 45 is connected to an intermediate portion of the current path of the laser 31 to control the quantity of current supplied to the laser 31 in accordance with the quantity of light emitted from the laser 31.

For this purpose, the quantity of light emitted from the laser 31 is detected by means of a photosensor 50, and the detected current is converted in a current-to-voltage converter 51 into a voltage signal proportional to the detected current, that is, the quantity of emitted light. Thus, the photosensor 50 and the current-to-voltage converter 51 constitute in combination a light quantity monitor circuit 52.

The voltage signal is supplied to a control circuit 53 where a control signal the level of which corresponds to the level of the voltage signal is generated. The variable constant-current circuit 45 is controlled by the output of the control circuit 53. The constant-current circuit 45 comprises a differential amplifier 46 and a transistor 47.

Accordingly, when the quantity of light emitted from the laser 31 exceeds that in a normal operation, the control signal obtained from the control circuit 53 decreases, and the driving current flowing through the laser 31 decreases correspondingly, so that the quantity of light emitted from the laser 31 is reduced.

In the above-described arrangement the laser 31 is controlled in accordance with the output of the control circuit 53 so that the driving current supplied to the laser 31 is maintained at a constant level. However the laser 31 has disadvantageous temperature characteristics, so that the quantity of light emitted therefrom varies with changes in the ambient temperature.

Further, in the case where the laser 31 is subjected to light quantity feedback control (not shown), there is a fear of the quantity of emitted light becoming excessively large so as to lead to deterioration of the laser 31.

There is another means which is arranged to monitor the driving current flowing through the laser 31 and suspend the drive of the laser 31 when the current value exceeds a predetermined value. This means, however, cannot satisfactorily protect the laser 31 at all times if there are variations in characteristics of the laser 31 in terms of the relationship between the driving current and the quantity of emitted light.

It is a matter of course that the laser 31 cannot satisfactorily be protected even in the case of employment of a means which is arranged to suspend the drive of the laser 31 when the ambient temperature changes and the driving current exceeds a predetermined value.

FIG. 9 is a circuit diagram of another example of the laser driving circuit 40.

This laser driving circuit 40 is provided with a light quantity stabilizing circuit for stabilizing the quantity of light emitted from the laser in addition to a circuit for driving the laser in response to a described example.

The reason for the provision of the light quantity stabilizing circuit is that the temperature characteristics of lasers are exceedingly inferior and therefore, when the use of a laser in the environment where the ambient temperature may change is taken into consideration, there is a need for a light quantity stabilizing circuit for stabilizing the quantity of light emitted from the laser.

The laser 31 is excited by means of a driving current (exciting current) output from a current generating circuit 59 to emit a quantity of light which corresponds to the level of the driving current. The laser beam emitted from the laser 31 is received by a photosensor 50 to detect the quantity of light emitted from the laser 31, and a current corresponding to the detected light quantity is supplied to a current-to-voltage converter 51 where the current is converted into a voltage signal corresponding to the detected light quantity. Accordingly, the photosensor 50 and the current-to-voltage converter 51 cooperate with each other to function as a light quantity monitor circuit 52.

The voltage signal is supplied to a voltage comparing circuit 54 where it is compared with a reference voltage delivered from a reference voltage source 62, and the output of the voltage comparing circuit 54 is supplied as an up/down control signal to an up/down counter 56.

The counter 56 is arranged to count clocks of a predetermined frequency which are supplied from an oscillator 57. The counter 56 is supplied at a clear terminal CLR thereof with a clear signal Sc which is delivered from a microprocessor (microcomputer) which controls the reproducing machine, to clear the counter 56. The counter 56 is further supplied at an enable terminal EN thereof with a count enable signal Sh.

The digital output from the counter 56 is converted into an analog signal in a D/A converter 58 which is connected to the output side of the counter 56, and this analog signal is supplied as a current control signal to a current generating circuit 59.

When the count enable signal Sh is available after the counter 56 has been cleared in response to the clear signal Sg, the current generating circuit 59 is supplied with a control signal (a high-level signal) in place of the modulation signal from the microcomputer through an OR circuit 55. At the same time, the count enable signal Sh activates the counter 56 to start a count-up operation, and as the count-up operation proceeds, the driving current supplied to the laser 31 increases gradually. When the laser 31 is excited, the quantity of laser light also increases gradually.

Until the laser light quantity reaches a predetermined level, the output of the voltage comparing circuit 54 is maintained at a high level, and the counter 56 is thus allowed to continue the count-up operation. When the laser light quantity reaches a predetermined level, the output of the voltage comparing circuit 54 is inverted to a low level, thus causing the counter 56 to be shifted to the down-count mode, and as the count-down operation of the counter 56 proceeds, the laser light quantity decreases gradually contrary to the above. However, when the laser light quantity lowers to a level at which the output of the voltage comparing circuit 54 is inverted, the operation mode of the counter 56 is inverted to the up-count mode.

Accordingly, ff the control is effected so that the count enable signal Sh is turned OFF when a predetermined period of time has elapsed, then the counter 56 holds an output level immediately before the signal Sh is turned off, so that the laser 31 is excited with a constant driving current at all times and the quantity of light emitted from the laser 31 is maintained at a constant level at all times.

Thus, the laser 31 is modulated on the basis of a modulation signal supplied to the terminal 43 in a state wherein the quantity of light emitted from the laser 31 is controlled so as to be maintained at a constant level, and an electrostatic latent image corresponding to image data concerning a particular document is formed on the drum 11 which serves as an image retainer.

FIG. 10 shows the relationship between the driving current supplied to the laser 31 and the quantity of light emitted therefrom. As will be clear from the graph shown in FIG. 10, the quantity of emitted light increases in extremely minute amounts until the driving current reaches a predetermined value Ith. However, when the driving current exceeds Ith, the light quantity increases rapidly.

In the light quantity stabilizing circuit shown in FIG. 9, the counter 56 performs either a count-up or count-down operation in which the count is incremented or decremented by one, and therefore, it will take considerably long time for the driving current to reach the above-described point of inflection Ith when it increases from zero.

The control operation for holding the light quantity at a constant level is generally conducted as one step in a pre-processing (a warming-up processing) which is carried out before printing for one page is executed. Therefore, when the stabilization of laser light quantity takes much time, the output of an image to be recorded is delayed and the operator must stand by for an undesirably long time.

SUMMARY OF THE INVENTION

It is an object of the present invention to provide a semiconductor laser device which is so designed that the above-described problems are solved with a simple arrangement and wherein it is possible to effectively prevent deterioration of the incorporated laser and also reliably protect it.

To this end, the present invention provides a semiconductor laser device comprising: a light quantity monitor circuit for monitoring the quantity of light emitted from a semiconductor laser; a comparator circuit for making a comparison between the output of the monitor circuit and a reference value; and an emission inhibiting means for inhibiting the semiconductor laser from emitting light in accordance with the output of the comparator circuit.

The above-described emission inhibiting means is adapted to inhibit the supply of an optical modulation signal to the semiconductor laser and therefore may be arranged so as to lower the output of a current source for driving the semiconductor laser or to lower the output of a voltage source for driving the semiconductor laser.

When the detected quantity of light exceeds a set value, the emission inhibiting means is activated so that the optical modulation signal supplied to the laser is forcedly set to zero or the laser driving current path is controlled appropriately.

Thus, there is no fear of the laser being supplied with a current which is excessively larger than that in a normal operation, and it is therefore possible to prevent deterioration and destruction of the laser.

It is another object of the present invention to provide a semiconductor laser device which is so designed that the time required for the stabilization of the light quantity can be reduced by a large margin.

To this end, the present invention provides a semiconductor laser device comprising: A/D converting means for converting a voltage output from a light quantity monitor circuit into a digital quantity, the monitor circuit being arranged to detect the quantity of light emitted from a semiconductor laser; means for controlling the digital quantity so that the output of the A/D converting means is within a predetermined range; a D/A converting means for converting the output of the control means into an analog signal; current generating means for supplying the semiconductor laser with a predetermined driving current in accordance with the analog signal; and means for comparing the quantity of light emitted from the laser with a predetermined value.

The above-described control means has means for selecting either an increment or a decrement of the quantity of light.

The increment or decrement of the above-described digital quantity is selected so as to satisfy the following condition:

$$A > B$$

where A is selected when the output of the light quantity monitor circuit is below a predetermined light quantity, and B is selected when said output is above the predetermined value.

When the detected light quantity is less than a set value, a count-up operation is successively executed for each increment A, whereas, when the detected light quantity is more than the set value, a count-up operation is successively executed for each increment B contrary to the above.

Accordingly, even in the case where the control is effected so that the light quantity which is zero is increased to reach a predetermined level, the time required for the light quantity to reach the predetermined level is reduced by a large margin.

The above and other objects, features and advantages of the present invention will become more apparent from the following description taken in conjunction with the accompanying drawings.

BRIEF DESCRIPTION OF THE DRAWINGS

FIG. 7 shows the arrangement of one example of a laser beam scanner which is employed to describe the present invention;

FIG. 8 is a circuit diagram of a driving circuit for a conventional semiconductor laser device;

FIG. 9 is a circuit diagram of a driving circuit for another conventional semiconductor device;

FIG. 10 is a characteristic chart showing the relationship between the laser exciting current and the quantity of light emitted from the laser;

FIG. 11 is a circuit diagram of an essential part of a still further embodiment of the semiconductor laser device according to the present invention;

FIGS. 12A, 12B and FIGS. 13A, 13B are graphs which are employed to describe the operation of the embodiment shown in FIG. 11;

FIG. 15 is a connection diagram of a light quantity monitor, circuit;

FIGS. 16 and 17 are connection diagrams each showing one example of a driving circuit for a light quantity adjustable semiconductor laser according to the present invention;

FIG. 19 is a circuit diagram of one example of each of the forced lighting means and the input control means;

FIG. 20 is a connection diagram of one example of the low-pass filter;

FIG. 21 is a circuit diagram of one example of the lighting inhibit means; and

FIG. 22 is a waveform chart employed to describe the operation which takes place when the microcomputer goes out of control.

DESCRIPTION OF THE PREFERRED EMBODIMENTS

One embodiment of the semiconductor laser device according to the present invention will be described hereinunder in detail with reference to FIG. 1.

Figure 1:
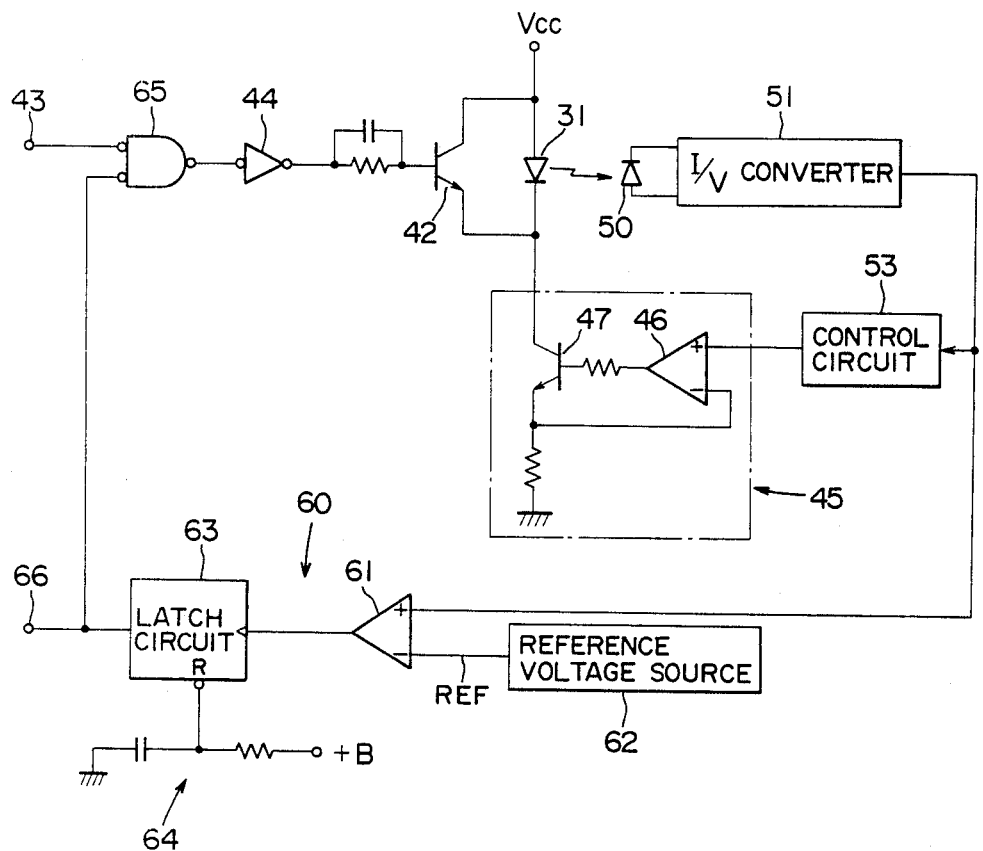
FIG. 1 is a circuit diagram of an essential part of one embodiment of the semiconductor laser device according to the present invention.

FIG. 1 shows one example of a driving circuit 40 for the semiconductor laser device according to the present invention, description of the same members or portions as those shown in FIG. 8 being omitted.

According to the present invention, the arrangement is such that, when the quantity of light emitted from the laser 31 exceeds a predetermined value, the emission of light from the laser is inhibited by the operation of an emission inhibiting means.

In the embodiment shown in FIG. 1, an input negation type NAND circuit 65 is provided at the input side of the driver 44 and supplied with a modulation signal and an emission inhibit signal formed in an emission inhibiting means 60.

Figure 2:
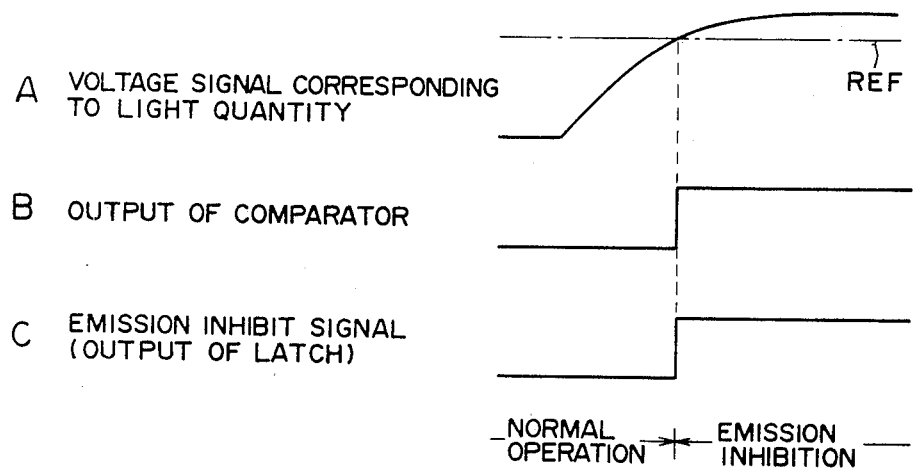
FIG. 2 is a waveform chart showing the operation of the embodiment shown in FIG. 1.

The emission inhibiting means 60 has a comparator circuit 61 and a latch circuit 63 and is arranged such that a voltage signal obtained from the current-to-voltage converter 51 and a reference voltage from a reference voltage source 62 are compared with each other in the comparator circuit 61 and, when the voltage signal exceeds the reference voltage, the output of the comparator circuit 61 is inverted to a high level (see A and B in FIG. 2).

The output of the comparator circuit 61 is latched by the latch circuit 63 which is in a state wherein it is reset to a low level in response to a reset signal obtained when the power supply of the apparatus is turned on. The reference numeral 64 denotes a reset circuit.

The output of the latch circuit 63 is supplied as an emission inhibit signal to the above-described NAND circuit 65 and is also supplied as an abnormal light quantity signal to a microcomputer (not particularly shown) which is in charge of control of the main body of the apparatus. The numeral 66 denotes an output terminal for delivering the output of the latch circuit 63 to the microcomputer.

In this arrangement, when the laser 31 is in a normal state wherein it is excited to emit light at a normal level, the level of a voltage signal at that time is lower than a reference voltage REF, and the output of the comparator circuit 61 is maintained at a low level. Accordingly, the output of the latch circuit 63 is also maintained at a low level, and the transistor 42 is thus ON/OFF controlled in accordance with the modulation signal itself.

On the other hand, when the voltage signal corresponding to the quantity of light emitted from the laser 31 rises abnormally to exceed the reference voltage value REF, the output of the comparator circuit 61 is inverted. In consequence, the output of the latch circuit 63 is also raised to a high level (see C in FIG. 2).

When the output of the latch circuit 63 is inverted to the high level, the emission inhibit signal is held at "1" at all times irrespective of the level of the modulation signal due to the existence of the NAND circuit 65, and the transistor 42 is held in an ON state at all times, resulting in the laser 31 being forcedly inhibited from lighting.

Thus, there is no fear of the laser 31 being supplied with a driving current with which the quantity of light emitted from the laser 31 exceeds a predetermined light quantity. This control condition is kept unchanged even when the ambient temperature of the laser 31 changes or there is a change in the current-emission quantity characteristics of the laser 31.

Figure 3:
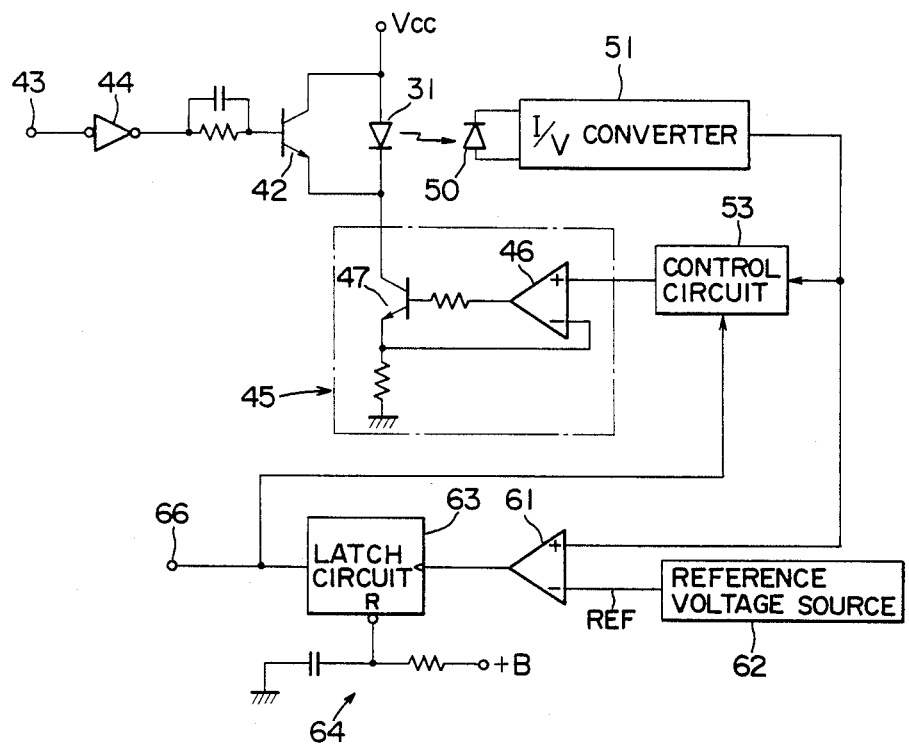
FIGS. 3 to 5 are circuit diagrams similar to FIG. 1 which, respectively, show other embodiments of the present invention.

FIG. 3 shows another embodiment of the present invention, in which the variable constant-current circuit 45 is used in the same way as in the embodiment shown in FIG. 1 and an emission inhibit signal is supplied to the control circuit 53 for controlling the variable constant-current circuit 45 to thereby control the laser 31.

Accordingly, in this embodiment the modulation signal supplied to the terminal 43 is supplied directly to the driver 44 and the output of the latch circuit 63 is supplied to the control circuit 53. When the output of the latch circuit 63 is supplied to the control circuit 53, the variable constant-current circuit 45 is controlled by the operation of the control circuit 53 so that the driving current flowing through the laser 31 becomes minimum or zero. As a result, even if the quantity of light emitted from the laser 31 becomes abnormally high due to the above-described causes, such a state can promptly be detected, so that it is possible to prevent premature deterioration or destruction of the laser 31.

Figure 4:
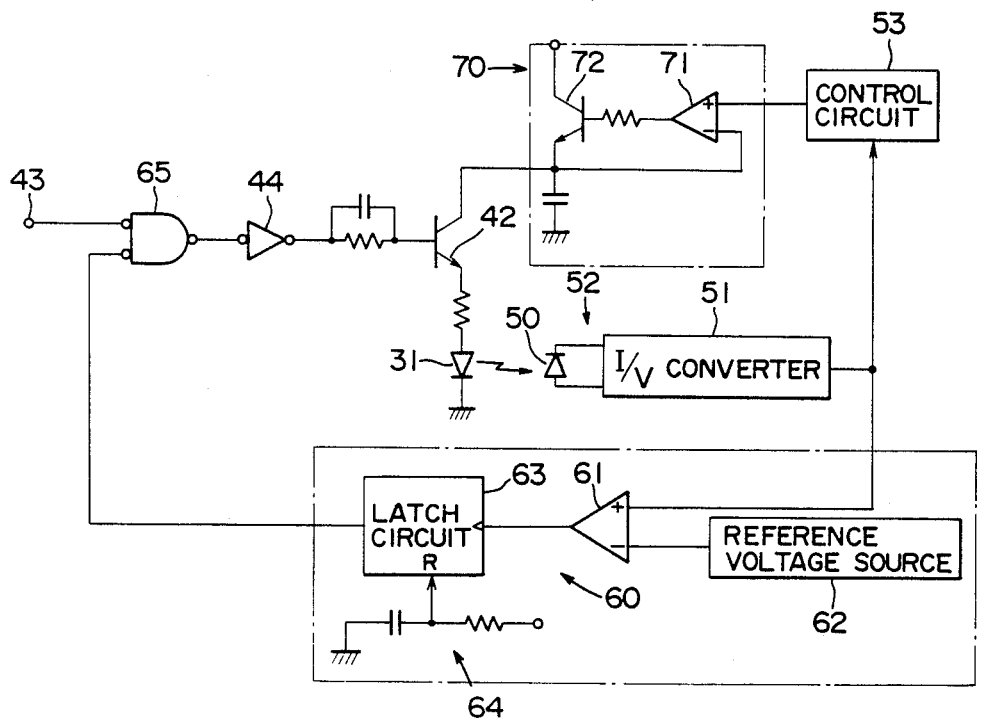

FIG. 4 shows still another embodiment of the present invention which corresponds to the embodiment shown in FIG. 1 and which employs a variable constant-voltage circuit 70 as a laser driving system.

More specifically, the variable constant-voltage circuit 70 comprises a voltage adjusting differential amplifier 71 and a variable impedance element (transistor) 72 which functions as a voltage adjusting element. The current bypass transistor 42 is connected in series to the emitter side of the transistor 72, and the laser 31 is connected in series to a portion of the current path of the transistor 42.

The output of the current-to-voltage converter 51 is supplied to the control circuit 53, and control is effected so that a predetermined power supply voltage is applied to the transistor 42 in a normal state. However, when the driving current flowing through the laser 31 becomes abnormally large, the level of the voltage signal also becomes high correspondingly. Accordingly, the variable constant-voltage circuit 70 is controlled so as to lower the voltage applied to the transistor 42. Thus, the laser 31 is prevented from being supplied with an excessively large driving current by a control operation similar to that of the embodiment shown in FIG. 1.

Figure 5:
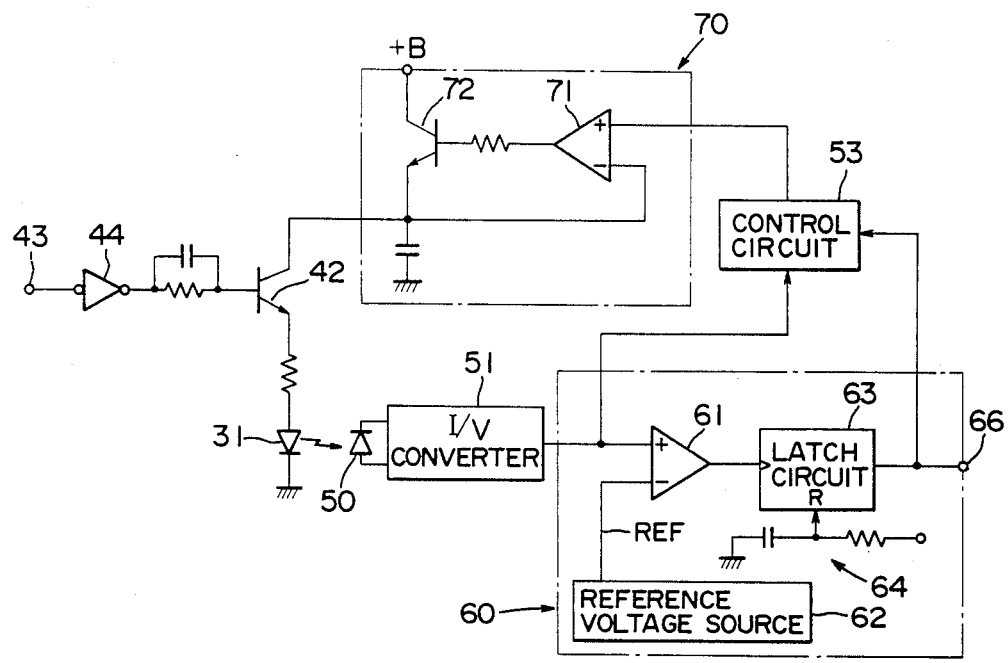
Figure 6:
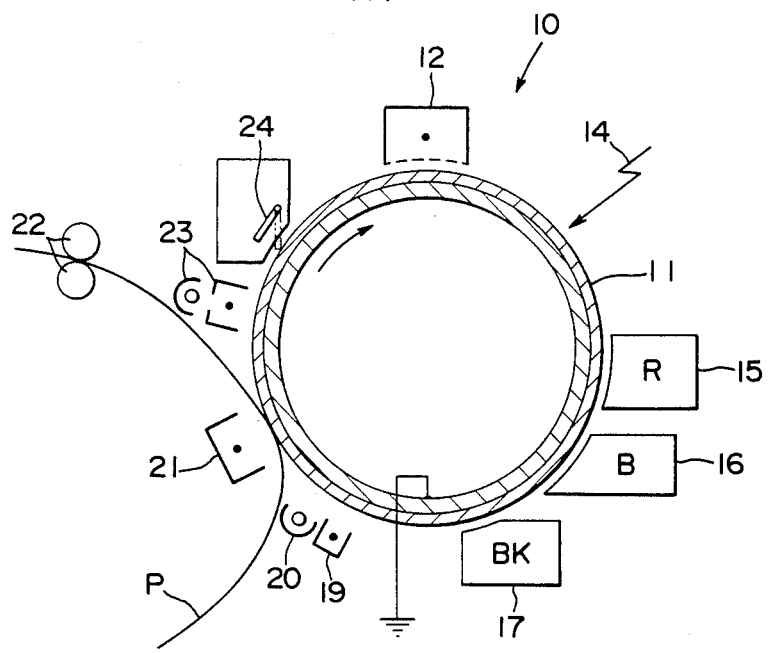
FIG. 6 shows the arrangement of an essential part of one example of a simple type color reproducing machine to which the present invention may suitably be applied.

FIG. 5 shows a further embodiment of the present invention which corresponds to the embodiment shown in FIG. 3 and which employs the same variable constant voltage circuit 70 as that used in the embodiment shown in FIG. 4. In this embodiment, the output of the latch circuit 63 is supplied to the control circuit 53 and the modulation signal is supplied directly to the driver 44.

In this arrangement also, when the driving current flowing through the laser 31 becomes abnormally large, the control circuit 53 is activated to effect control so that the voltage applied to the transistor 42 is lowered.

It should be noted that a flip-flop may be employed in place of the latch circuit 63 in each of the above-described embodiments.

As has been described above, each of the embodiments of the present invention is arranged such that an emission inhibiting means is provided for the laser 31 so as to inhibit emission of light from the laser 31 when, for example, the driving current flowing through the laser 31 becomes abnormally large. It is therefore possible to prevent premature deterioration and destruction of the laser 31 which would otherwise be caused by an excessively large driving current flowing through the laser 31.

Accordingly, the present invention may be applied to a simple type color reproducing machine or to a laser printer as described above.

Further, the present invention is particularly effective in coping with possible runaway of the CPU when the control of the light quantity is effected by the operation of the CPU.

In a still further embodiment of the present invention, as shown in FIG. 11, the voltage signal output from the current-to-voltage converter 51 is converted into a digital signal in an A/D converter 67 and then supplied to a microcomputer 68 where a signal for current control which is to be output to a D/A converter 58 is judged and determined on the basis of the value of the input digital signal.

Accordingly, the circuit system including the microcomputer 68 has a means for controlling the digital quantity which is to be given to the D/A converter 58 so that the output of the A/D converter 67 is maintained at a constant level, a means for making comparison between an A/D converted value and a predetermined value, and a means for selecting an increment or a decrement of the digital quantity which is to be given to the D/A converter 58 on the basis of the result of the comparison. The method of determining data to be output from the microcomputer 68 will be explained below.

The control signal output from the microcomputer 68 is latched in a latch circuit 69 and then supplied to the D/A converter 58 where it is converted into an analog control signal (current control signal) corresponding to the output signal This current control signal is supplied to a current generating circuit 59, so that the excited state of the laser 31 is controlled on the basis of the current control signal and the quantity of light emitted from the laser 31 is thus changed.

The microcomputer 68 outputs the following signals in accordance with the value of the input digital Namely, as shown in FIGS. 12A and 12B, when the maximum and minimum values of the laser light quantity required to write data are represented by $P_{max}$ and $P_{min}$ respectively, a light quantity which is smaller than the minimum value Pmin by a predetermined value is represented by P1. Light quantities between Pmin and Pmax are appropriate light quantity values.

When the detected light quantity is less than P1, the increment $\Delta V$ of the digital value which is to be given to the D/A converter 58 is set at A. When the detected light quantity is more than P1 and less than Pmin, the increment $\Delta V$ is set at B, and when the detected light quantity is equal to or more than Pmin, $\Delta V$ is set at $-B$ (i.e., a decrement in this case). It is selected as follows:

$$A>B>0$$

On the basis of a digital value V previously output to the D/A converter 58, $$V+\Delta V$$

is calculated, and control is effected so that the resultant of the calculation is output to the D/A converter 58 as a new digital value V.

It should be noted that the digital value V is set at an initial value 0 in an initialize routine executed when the power supply is turned on.

Thus, when a control routine for stabilization of light quantity is started, the laser 31 is excited with a current I1 which corresponds to the initial value $\Delta V$, and 2 $\Delta V$ is output to the D/A converter 58 as a new output signal in a subsequent step, so that the laser 31 is excited with a current I2 corresponding to 2 $\Delta V$.

Thereafter, a similar control operation is repeated, and when the detected light quantity reaches a value which is more than P1 and less than Pmin, B is used as $\Delta V$ in place of A.

As a result, the amount of change in current is smaller than that in the control operation which has theretofore been executed As the control routine is repeated, however, the detected light quantity increases gradually, and when it exceeds the maximum light quantity value Pmax, the exciting current is then controlled using $-B$ in place of B.

In this way, the detected light quantity settles down at a value in a range from Pmin to Pmax.

A and B may be set as follows

First, A is set at a value with which the detected light quantity slightly exceeds Pmin after the current control step has been repeated n times, while B is set at a value with which the detected light quantity exceeds Pmax after the current control step has been repeated one to several times.

The reason for setting A and B as described above is that, when A and B are excessively large, the detected light quantity cannot be converged on the range from Pmin to Pmax, whereas, when they are excessively small, much time is required for the detected light quantity to converge on said range.

Figure 14:
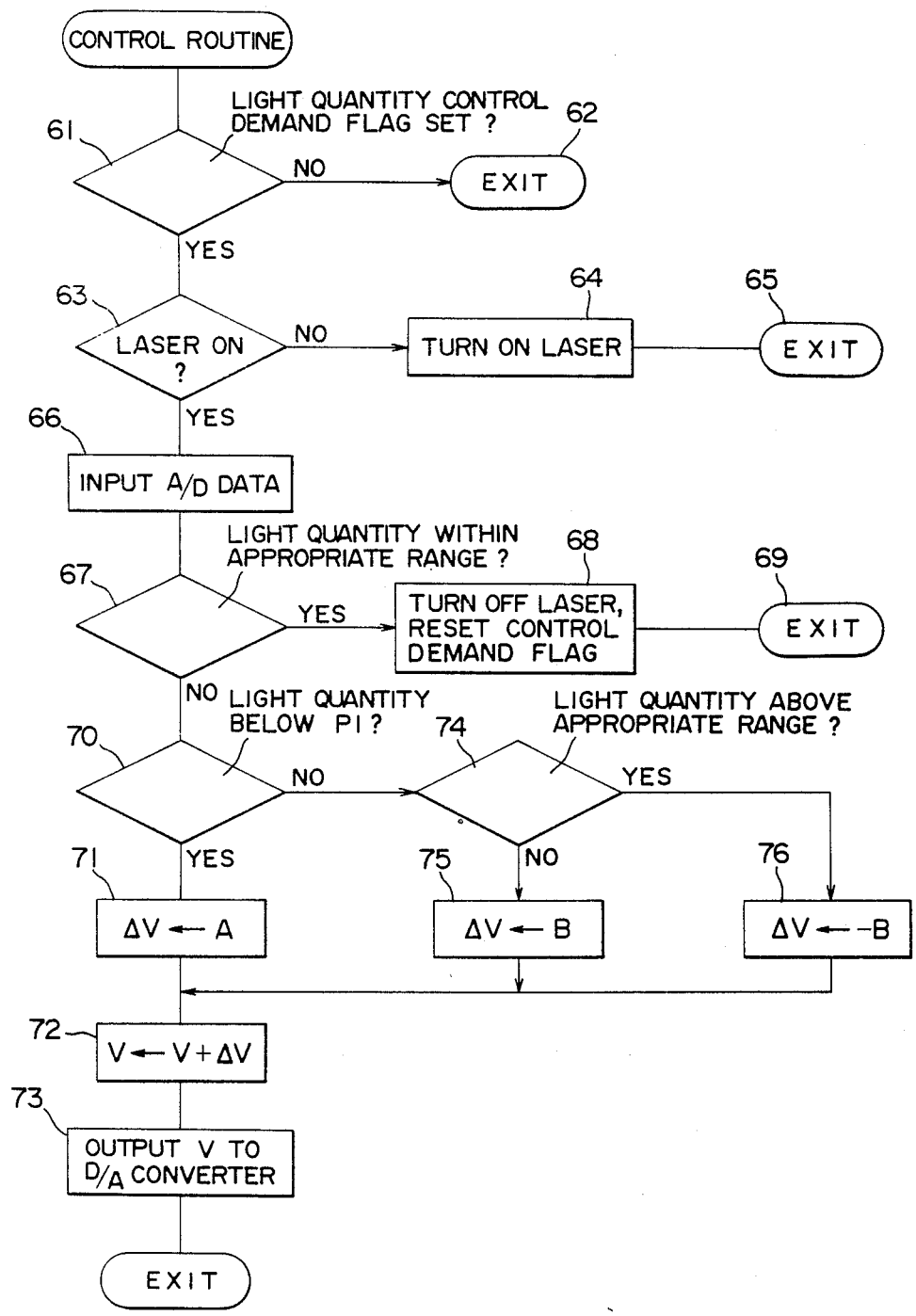
FIG. 14 is a control flow chart showing one example of the control operation for stabilizing the quantity of light emitted from the laser.

One example of a control program for the above-described stabilization of the light quantity will next be explained with reference to FIG. 14.

First, when a control routine for stabilization of the light quantity is called, a check is made as to whether or not a light quantity control demand flag is set. If NO, the process gets out of this control routine (Steps 61 and 62). If the light quantity control mode is acknowledged in Step 61, a judgement is made as to whether or not the laser 31 is in an ON state. If NO, that is, if the laser 31 is in an OFF state, control is effected so that the laser 31 is turned on, and the process gets out of this control routine (Steps 63 to 65).

When the laser 31 is in an ON state, A/D converted data corresponding to the detected light quantity is input, and a judgement is made as to whether or not the detected light quantity is within the appropriate range (Steps 66 and 67). If YES, that is, if the detected light quantity is within the appropriate range (between Pmin and Pmax), the laser 31 is turned off, and the light quantity control demand flag is reset, and then the process gets out of this control routine and returns to the control routine for the main processing (Steps 68 and 69).

When the detected light quantity is out of the appropriate range, the level of the detected light quantity is compared with the set light quantity P1, and when the former is less than the latter, the increment A is set as $\Delta V$, and $V + \Delta V$ is then output as V to the D/A converter 58 (Steps 71 to 73).

In the first control routine, the digital value V has been initialized.

When the fact that the detected light exceeds P1 is detected, a judgement is made as to whether or not the detected light quantity is within the appropriate range (between Pmin and Pmax). If it is less than Pmin, the increment B is set as $\Delta V$, and $V + \Delta V$ is then output as V to the D/A converter 58 (Steps 74 and 75).

When the detected light quantity exceeds Pmax as a result of such a control operation, the process shifts to Step 76 where the decrement $-B$ is set as $\Delta V$, and $V - \Delta V$ is then output to the D/A converter 58. Accordingly, after Step 74 in this control routine has been called a plurality of times, the quantity of light emitted from the laser 31 is controlled within the range from Pmin to Pmax.

Thus, the quantity of light emitted from laser 31 has a light quantity value (appropriate light quantity value) between Pmin and Pmax a times.

The control routine is executed by a time interruption.

The timer interruption routine is a subroutine for maintaining the rotation of the drum 11 and the image data writing (electrostatic image writing) timing in a predetermined relation to each other at all times.

In this case, the above-described light quantity control program is placed within the timer interruption routine or, alternatively, when a timer interruption occurs, a flag is set, and the flag is check in the main routine, and the control routine is executed only when the flag is set.

Since the output of the D/A converter 58 may have glitches (whisker-shaped noise), it is common practice to provide a low-pass filter at the output side of the D/A converter 58. Accordingly, the response of the circuit is relatively slow and , further the A/D converter 58 takes time to perform conversion. For this reason, it is convenient to execute the light quantity control processing by a timer interruption routine.

Although in the above-described embodiment the light quantity control starts from zero, the control routine may be arranged so that the control starts from a predetermined value which is lower than the light quantity P1.

More specifically, although in the above-described embodiment the initial value of data V which is to be given to the D/A converter 58 is set so as to be $V=0$, it may be set as follows:

$$V = V0 \; (0 < V0 < V1)$$

where V1 is data to be given to the D/A converter 58 which corresponds to the light quantity P1 at a certain temperature.

In this case, the relationship between the light quantity and the driving current is such as that shown in FIGS. 13A and 13D. Therefore, it is possible to further reduce the control time required to stabilize the detected light quantity at an appropriate value.

It should be noted that the microcomputer 68 in the above-described embodiment may be provided as a special purpose microcomputer used exclusively for stabilization of the light quantity, or the microcomputer which is in charge of control of the main body of the apparatus may be used to also serve as the microcomputer 68.

When the microcomputer 68 per se has an A/D converting function, the A/D converter 67 which A/D converts an appropriate light quantity value may be omitted.

Similarly, when the microcomputer 68 per se has a latch function, or when the D/A converter 58 which has a latch function is used, the latch circuit 69 may, of course, be omitted.

Although in this embodiment a value which is obtained by I/V conversion and successive A/D conversion is compared with a predetermined value to determine the increment $\Delta V$, $\Delta V$ may be determined simply by making a comparison between the detected light quantity and the predetermined value.

As has been described above, in this embodiment the output current for controlling the driving current supplied to the laser 31 is controlled on the basis of the increment A or B or the decrement $-B$. Therefore, the adjusting time required for stabilization of the light quantity can be reduced by a large margin as compared with the means shown in FIG. 9 in which the detected light quantity is converged on an appropriate light quantity value by incrementing or decrementing the output current for each clock obtained from the oscillator 57.

If the adjusting time required for stabilization of the laser light quantity can be reduced, it is also possible to reduce the period of time which starts at the time when the copy operation is started and which ends at the time when a reproduced image is actually output. Accordingly, the operator's stand-by time can also be shortened, and his/her irritation can be eased, which is a secondary advantageous effect.

Accordingly, the present invention may suitably be applied to a simple type color reproducing machine or the like as described above.

The light quantity monitor circuit 52 used in the driving circuit 40 shown in FIG. 11 may adopt an arrangement such as that shown in FIG. 15.

The light quantity monitor circuit 52 comprises of the photosensor 50 and the current-to-voltage converting means 51 described above, and the current-to-voltage converting means 51 may be defined by an operational amplifier as shown in FIG. 15. The current-to-voltage converting means 51 will hereinafter be referred to as the "operational amplifier" for convenience of description.

A detected current corresponding to a light quantity detected by means of the photosensor 50 is converted into a voltage corresponding to the detected current by means of a resistor 81 connected to the (+) terminal of the operational amplifier 51, and this voltage signal is amplified in the operational amplifier 51.

The amplification factor of the operational amplifier 51 is determined by the values of a plurality of resistors 82 to 84 connected between the (−) terminal and the output side of the amplifier 51.

The relationship between the laser light quantity and the detected current considerably varies in accordance with the light quantity-current characteristics of the photosensor 50, but the relationship between the laser light quantity and the output voltage of the operational amplifier 51 can be maintained in a predetermined proportional relation (e.g., a relation wherein, when the laser light quantity is 3 mW, the output voltage VM is 3V (volts)) at all times by adjusting a variable resistor 84 which is provided for the operational amplifier 51.

The output voltage VM is supplied to the microcomputer 68 to execute monitoring of the laser light quantity.

The reason why the output voltage VM is used as a light quantity monitoring signal is that the quantity of light emitted from the laser 31 cannot be measured directly with an optical power meter or the like since the collimator lens 32 is disposed in close proximity with the laser 31. Accordingly, it is extremely important to obtain the output voltage VM which is in a predetermined proportional relation to the laser light quantity.

Even if the laser light quantity is controlled so as to be maintained at a constant level as described above, it may be necessary to change the laser light quantity due to deterioration of the photoconductive photosensitive surface layer formed on the surface of the drum 11 or due to stains on the optical system after the use of the reproducing machine for a long period of time.

In such a case, it may be possible to correct data (Pmin to Pmax) representing an appropriate light quantity range stored in a ROM in which the control program has been written. However, in such an arrangement, it is troublesome to rewrite data in the ROM and the maintenance conducted by a service engineer to adjust the laser light quantity is complicated In place of such a means, it is also possible to adopt an arrangement in which the output voltage VM is apparently changed by adjusting the variable resistor 84 shown in FIG. 15.

In this case, however, an actual quantity of light emitted from the laser 31 cannot be monitored, and therefore there is a fear of the quantity of light to be emitted from the laser 31 being erroneously set at a value above an absolute rated light quantity.

In order to solve the above-described problems, a semiconductor laser device in accordance with a still further embodiment of the present invention comprises, as shown in FIG. 16, a monitor circuit for monitoring the quantity of light emitted from a semiconductor laser, and A/D converting means for converting a voltage output from the light quantity monitor circuit into a digital quantity, a means for controlling a D/A converting means, and a current generating means for supplying the semiconductor laser with a predetermined driving current in accordance with an analog signal from the D/A converting means.

The light quantity monitor circuit comprises a current-to-voltage converting means for obtaining a voltage which is proportional to the quantity of light emitted from the semiconductor laser and a voltage adjusting means for obtaining a voltage which is proportional to the output of the current-to-voltage converting means.

As the voltage adjusting means, it is possible to employ a variable resistance type potential divider circuit or an operational amplifier whose amplification factor is adjustable.

In this embodiment, if the output voltage of the monitor circuit is varied by the operation of the voltage adjusting means, the driving current flowing through the laser 31 is controlled as desired, so that the control of the laser light quantity can be facilitated.

Since the current-to-voltage converting means outputs a voltage VM which is proportional to the quantity of light emitted from the semiconductor laser, if the output voltage VM is monitored, it is possible to make an accurate check as to whether or not the laser light quantity has been controlled so as to exceed an absolute rated light quantity.

Since the embodiment shown in FIG. 16 is an arrangement which is applied to the semiconductor laser device shown in FIG. 11, description of the arrangement and operation of the driving circuit 40 is omitted.

Referring to FIG. 16, which shows one example of an arrangement which may preferably be applied to a light quantity monitor circuit 52 used in the driving circuit 40, the light quantity monitor circuit 52 comprises of a photosensor 50 which is a photoelectric transducer and a current-to-voltage converting means 51 in the same way as the above.

A resistor 81 which functions as a current-to-voltage converting element is connected to the (+) terminal of the operational amplifier 51, and the photosensor 50 is connected across the resistor 81, whereby a detected current which corresponds to the laser light quantity is converted into a voltage which is proportional to the detected current.

A plurality of resistors 82 to 84 which determines the amplification factor of the operational amplifier 51 are connected between the (−) terminal and the output side of the amplifier 51. The variable resistor 84 is an adjusting element employed to make it possible to obtain an output voltage VM which is in a predetermined proportional relation to the detected current.

The output voltage VM is supplied to a voltage adjusting means 85 which is connected to the output side of the light quantity monitor circuit 52. In this example, the voltage adjusting means 85 is defined by a resistance-type potential divider circuit comprising of a pair of resistors 86 and 87 which are connected in In this case, one resistor 86 is of variable type, and an output terminal 80 is led out from the movable terminal of the variable resistor 86. By adjusting this variable resistor 86, the value of the output voltage VM is adjusted, and the adjusted output voltage VM' is supplied to the A/D converter 67 shown in FIG. 11

In the above-described arrangement, since the voltage adjusting means 85 is supplied with an output voltage VM which is proportional to the detected light quantity, a voltage VM' which is proportional to the output voltage VM is obtained at the output terminal 80 by adjusting the variable resistor 86. Accordingly, adjustment of the variable resistor 86 enables the value of a digital signal input to the microcomputer 68 to be adjusted, so that it is possible to adjust the quantity of light emitted from the laser 31.

Thus, when it is necessary to change the laser light quantity due to deterioration of the photosensitive surface layer provided on the drum 11 or stains on the optical system, a desired appropriate light quantity value can be obtained simple by adjusting the voltage adjusting means 85.

The resistor 87 is employed in order to prevent VM' from being erroneously set to 0V when the variable resistor 86 is adjusted.

Since even after the adjustment of the quantity of laser light the output voltage VM is in proportional relation to the laser light quantity after the adjustment, it is possible to reliably make a check as to whether or not the laser light quantity has been adjusted so as to exceed an absolute rated light quantity simply by monitoring the output voltage VM.

FIG. 17 shows a still further embodiment of the present invention.

In this example, an operational amplifier is employed as the voltage adjusting means 85. The output voltage VM is supplied to the (+) terminal of the operational amplifier 88, and the output side of the operational amplifier 88 is connected to the output terminal 80. The amplification factor of the operational amplifier 88 is adjusted by means of one resistor 90 among a pair of resistors 89 and 90 which is connected between the (−) terminal of the amplifier 88 and the output terminal 80.

Accordingly, by adjusting the resistor 90, the value of a digital signal input to the microcomputer 68 is varied, thus enabling the quantity of light emitted from the laser 31 to be adjusted to an appropriate value.

It should be noted that the microcomputer 68 in the above-described embodiment may be a special purpose microcomputer used exclusively for stabilization of the light quantity, or the microcomputer which is in charge of control of the main body of the apparatus may be used to also serve as the microcomputer 68.

When the microcomputer 68 per se has an A/D converting function, the A/D converter 67 which A/D converts an appropriate light quantity value may be omitted.

Similarly, when the microcomputer 68 per se has a latch function, or when the D/A converter 58 which has a latch function is used, the latch circuit 69 may, of course, be omitted.

As has been described above, in this embodiment, the light quantity monitor circuit 52 is provided with the voltage adjusting means 85 by which the quantity of light emitted from the laser 31 is adjusted. Thus, the embodiment has the following advantageous features.

First, since the laser light quantity can be adjusted by the voltage adjusting means 85, when it is necessary to adjust the light quantity due to deterioration of the photosensitive surface layer provided on the drum 11 or stains on the optical system, the adjustment of the light quantity can be effected considerably easily. Accordingly, the time required for adjustment of the light quantity can be reduced by a large margin.

Secondly, even if the light quantity should be erroneously adjusted so as to exceed an absolute rated value in the adjustment of the light quantity, the erroneous adjustment can be readily checked by monitoring the value of the output voltage VM, and if such adjustment should be made, it is possible to immediately readjust the light quantity so as to be below the absolute rated value.

Thus, it is possible to prevent deterioration of the laser and reduction of its lifetime which would otherwise occur due to driving of the laser 31 at a light quantity above the absolute rated value.

Thirdly, since it is possible to adjust the quantity of light emitted from the laser 31 to desired value without changing data representing an appropriate light quantity value stored in the ROM which is provided in the microcomputer 68, maintenance and inspection are facilitated considerably.

Accordingly, the present invention may suitably be applied to a simple type color reproducing machine or a laser printer as described above.

When stabilization of light quantity, carried out to obtain an appropriate light quantity, is executed using the microcomputer 68 as described above, if an external noise enters the microcomputer 68, it may go out of control.

If the microcomputer 68 goes out of control, the output value therefrom cannot maintain the light quantity level obtained at the time of stabilization of the light quantity.

In such a case, when the output value from the microcomputer 68 rises abnormally due to runaway, the current generating circuit 59 is undesirably controlled so that the laser driving current is larger that in a normal operation.

Accordingly, if the driving current is excessively large for the laser 31, there is a fear of the laser 31 being destroyed by this excessively large current.

Since the driving circuit 40 shown in FIG. 11 has no means for protecting the laser 31 from such runaway, if the microcomputer 68 goes out of control, the laser 31 cannot effectively be protected.

Figure 18:
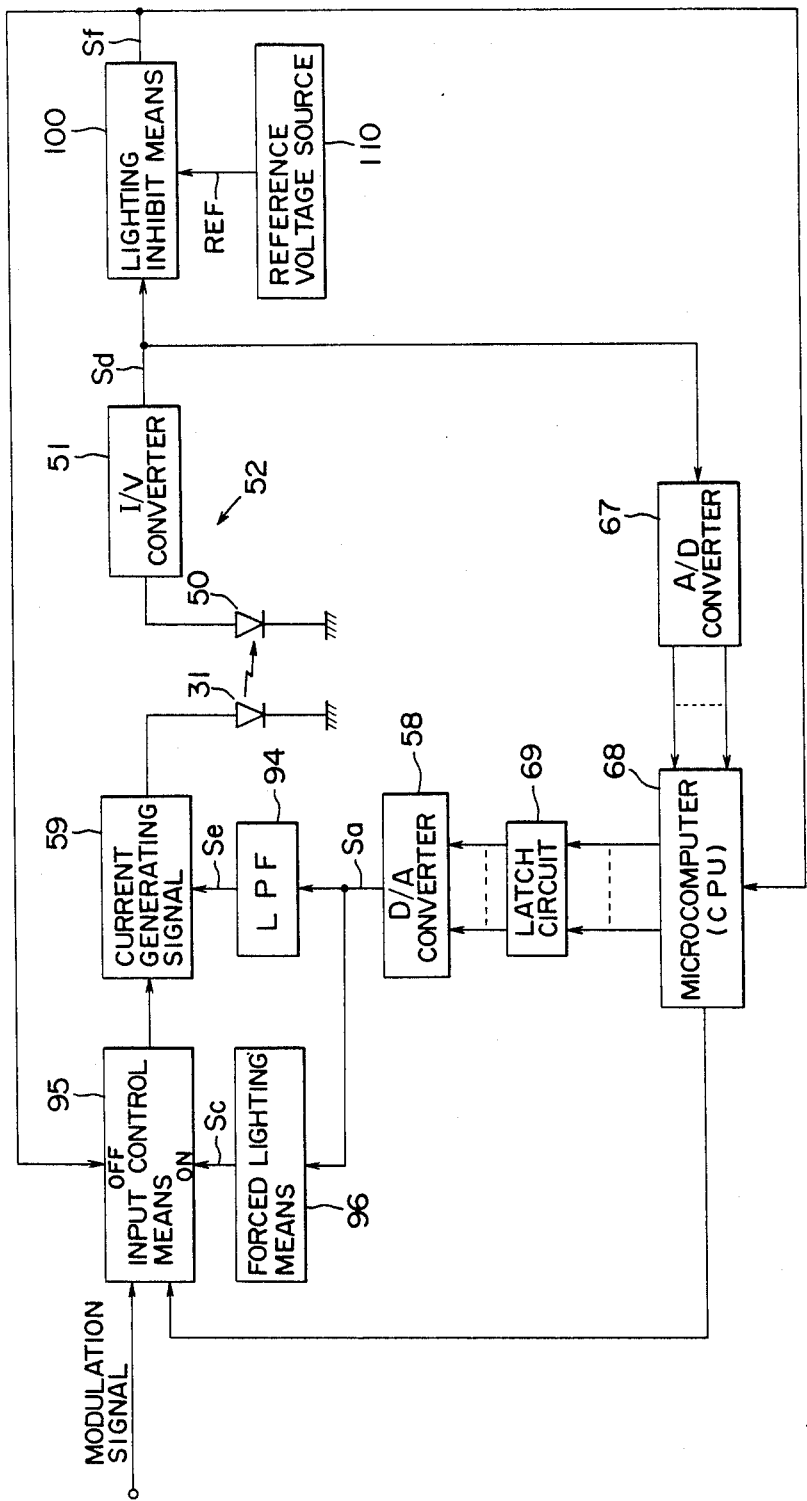
FIG. 18 is a circuit diagram of an essential part of a still further embodiment of the semiconductor laser device according to the present invention.

In order to solve the above-described problem, a semiconductor laser device in accordance with a still further embodiment of the present invention comprises, as shown in FIG. 18, a light quantity monitor circuit for monitoring the quantity of light emitted from a semiconductor laser, an A/D converting means for converting a voltage output from the light quantity monitor circuit into a digital quantity, a D/A converting means for converting the digital quantity into an analog signal, a current generating means for supplying the semiconductor laser with a predetermine driving current in accordance with the analog signal, and a microcomputer for controlling the digital quantity which is to be given to the D/A converting means so that the output of the A/D converting means is maintained within a predetermined range.

This embodiment further comprises a forced lighting means for turning on the semiconductor laser for a predetermined period of time when the output of the D/A converting means is detected as having changed in one direction, and a lighting inhibit means for inhibiting lighting of the semiconductor laser when the voltage output from the light quantity monitor circuit is detected as exceeding a predetermined value.

In this embodiment, if the microcomputer goes out of control, the level of a current control signal supplied to the current generating circuit changes suddenly. The point of time of this change is detected by the forced lighting means, and the laser is forcedly turned on irrespective of whether or not the modulation signal is available.

The lighting inhibit means can detect the fact that the quantity of light emitted from the laser exceeds a predetermined value as a result of the forced lighting of the laser. When the level of the laser light quantity is detected as exceeding a predetermined value, the lighting of the laser is forcedly inhibited, whereby it is possible to prevent destruction of the laser due to an excessively large driving current. This inhibit circuit has priority to the forced lighting circuit A semiconductor laser device in accordance with a still further embodiment of the present invention comprises a low-pass filter for filtering a current control signal obtained from the D/A converting means and supplying the filtered signal to the current generating circuit, a forced lighting means for turning on the semiconductor laser for a predetermined period of time when the output of the D/A converting means is detected as having changed in one direction, and a lighting inhibit means for inhibiting lighting of the semiconductor laser when the voltage output from the light quantity monitor circuit is detected as exceeding a predetermined value.

In this embodiment, if the microcomputer goes out of control, the level of a current control signal supplied to the current generating circuit changes suddenly. The point of time of this change is detected by the forced lighting means, and the laser is forcedly turned on irrespective of whether or not the modulation signal is available.

The lighting inhibit means can detect the fact that the quantity of light emitted from the laser exceeds a predetermined value as a result of the forced lighting of the laser. When the level of the laser light quantity is detected as exceeding a predetermined value, the lighting of the laser is forcedly inhibited, whereby it is possible to prevent destruction of the laser due to an excessively large driving current. Since any excessively large current is filtered through the low-pass filter, there is no fear of an excessively large current rising suddenly. Accordingly, circuit elements whose response speed is relatively slow can be employed as circuit elements for constituting the forced lighting means 96 and the lighting inhibit means 100 which define in combination a laser protecting means.

Since the embodiment shown in FIG. 18 is an arrangement which is applied to the semiconductor laser device shown in FIG. 11, description of the same members and portions as those in the arrangement shown in FIG. 11 is omitted.

FIG. 18 shows one example of the laser driving circuit 40 including a laser protecting circuit.

In FIG. 18, a current control signal Sa obtained from the D/A converter 58 is supplied to the current generating circuit 59 through a low-pass filter 94.

An input control means 95 for controlling the input of a lighting signal to the laser 31 is provided at the input side of the current generating circuit 59. The input control means 95 is supplied with a modulation signal corresponding to image data, a lighting control signal from microcomputer 68 which is used at the time of stabilization of the light quantity, together with a forced lighting signal Sc delivered from the forced lighting means 96 which is activated when the microcomputer 68 goes out of control and a lighting inhibit signal Sf delivered from the lighting inhibit means 100.

The forced lighting signal Sc is used for forcedly turning on the laser 31 for a predetermined period of time from the time at which runaway of the microcomputer 68 occurs, while the lighting inhibit signal Sf is used to forcedly inhibit lighting of the laser 31 when a level of the laser light quantity which is immediately lower than a level at which the laser 31 may be destroyed is detected from the laser light quantity detected after the laser 31 has been driven in response to the forced lighting signal Sc. The lighting inhibit signal Sf is also supplied to the microcomputer 68 as a runaway judging signal.

FIG. 19 shows practical examples of the forced lighting means 96 and the input control means 95.

The forced lighting means 96 comprises an edge detecting circuit 97 and a pulse generating section 98. The edge detecting circuit 97 is supplied with the current control signal Sa to detect a point of time of change in the signal level which is caused when the microcomputer 68 goes out of control.

In a normal state of use, the current control signal Sa is maintained at a constant level. However, when the microcomputer 68 goes out of control, the level of the current control signal Sa changes suddenly (see A in FIG. 22). The point of time of change in the signal level is detected, and an edge detecting signal Sb which is obtained at that time activates the pulse generating section 98 to generate a forced lighting signal Sc having a predetermined pulse width (see B and C in FIG. 22).

The input control means 99 comprises an OR gate 91 and an AND gate 92. The OR gate 91 is supplied with the modulation signal, together with the lighting control signal delivered from the microcomputer 68 and the above-described forced lighting signal Sc, and when any of these signals is supplied to the OR gate 91, an OR output is obtained.

The OR output and the lighting inhibit signal Sf are supplied to the AND gate 92 from which the OR output is supplied to the current generating circuit 59 alone as a lighting signal when the lighting inhibit signal Sf shown at F in FIG. 22 is at a high level; that is, when the laser 31 is in a normal operation mode.

On the other hand, when the microcomputer 68 is detected as being out of control, the light inhibit signal Sf is inverted to a low level, causing the AND gate 92 to be closed, and thus forcedly inhibiting the drive of the laser 31.

FIG. 20 shows an example of the low-pass filter 94. In this example, the low-pass filter 94 comprises by an RC time constant circuit which includes a resistor 103 and a capacitor 104, the time constant being set so as to be less than the pulse width T of the forced lighting signal Sc.

The reason why the low-pass filter 94 is provided in addition to the forced lighting means 96 as described above is based on the following fact.

In the case where the microcomputer 68 goes out of control when the modulation signal is in the state of "0", that is, when the laser 31 is in an inoperative state, if the current control signal Sa is at a level which is considerably higher than that in a normal state as shown at A in FIG. 22, the current generating circuit 59 is considered to be controlled so as to output a considerably large driving current. If, in this state, the modulation signal changes to "1", an excessively large current will instantaneously flow through the laser 31.

If such a state is instantaneously detected in the lighting inhibit means 100, the lighting signal delivered to the current generating circuit 59 is changed to "0", and therefore no particularly serious problem occurs.

However, when the circuit response speed of the lighting inhibit means 100 is relatively slow, there is a strong possibility of the laser 31 being destroyed by an excessively large current.

Further, in the case where the modulation signal changes to "1" when the output S1 (See A in FIG. 22) of the low-pass filter 94 has already reached the highest level of the current control signal Sa, there is also a strong possibility of the laser 31 being destroyed in the same way as in the case of the above, since the current generating circuit 59 is controlled so as to supply an excessively large current to the laser 31.

Therefore, the arrangement is such that, when the microcomputer 68 goes out of control, a predetermined lighting signal is supplied to the laser 31 irrespective of whether or not the modulation signal is available, and in synchronism with the lighting signal, the level of the current control signal Sa is gradually raised using the low-pass filter 94.

By so doing, the laser 31 is forcedly turned on even when the microcomputer 68 is out of control, and there is no fear of the laser 31 being suddenly supplied with the driving current. This is because the lighting inhibit means 100 detects the runaway state in the course of the gradual increase of the driving current and it is possible to suspend the drive of the laser 31 by means of the lighting inhibit signal Sf before the laser 31 is supplied with an excessively large current which is sufficient to destroy the laser 31.

Since the rise of the current control signal Sa is made gentle using the low-pass filter 94, circuit elements whose response speed is relatively slow may be employed for the lighting inhibit means 100 and the forced lighting means 96, and such a circuit elements are sufficient for practical application.

Accordingly, it is possible to use circuit elements whose response speed is relatively slow for the laser protecting means as a whole. Thus, the whole of the circuit can be provided at reduced costs Further, provision of the low-pass filter 94 makes it difficult for a surge current to flow through the laser 31, so that premature deterioration of the laser can be prevented.

FIG. 21 shows one example of the lighting inhibit means 100.

A voltage signal Sd which is proportional to the quantity of light is compared as to voltage with a reference voltage REF delivered from the reference voltage source 110 in a comparator circuit 101 (see D in FIG. 22). In the illustrated example, when the voltage signal Sd rises above the reference voltage REF, the output Se of the comparator circuit 101 is inverted to a high level (see E in FIG. 22).

The reference voltage REF is set so as to be above Pmax and below a level which is sufficiently high to destroy the laser 31.

The output Se of the comparator circuit 101 is supplied to a clock terminal of a D flip-flop 102. Since this flip-flop 102 has already been cleared at the time of turning on of the power supply for the apparatus, when it is supplied with a high-level output Se from the comparator circuit 101, a low-level lighting inhibit signal Sf is output from an inverting output terminal Q thereof (see F in FIG. 22).

As a result, when a runaway state of the microcomputer 68 is detected in this way, the level of the lighting inhibit signal Sf is inverted, and the ON state of the laser 31 is thereby forcedly turned off In consequence, the voltage signal Sd becomes zero as illustrated.

It should be noted that the microcomputer 68 in the above-described embodiment may be provided as a special purpose microcomputer used exclusively for stabilization of the light quantity or the microcomputer which is in charge of control of the main body of the apparatus may be used to also serve as the microcomputer 68.

When the microcomputer 68 per se has an A/D converting function, the A/D converter 67 which A/D converts an appropriate light quantity value may be omitted.

Similarly, when the microcomputer 68 per se has a latch function, or when the D/A converter 58 which has a latch function is used, the latch circuit 69 may, of course, be omitted.

As has been described above, since, according to this embodiment, the forced lighting means 96 and the lighting inhibit means 100 are provided, even if an excessively large current flows through the laser 31 due to the microcomputer 68 going out of control responsive to noise or the like, the runaway state can be detected instantaneously to forcedly inhibit the drive of the laser 31.

As a result, it is advantageously possible to prevent destruction of the laser 31 due to runaway of the microcomputer 68.

Further, since the existence of the low-pass filter 94 prevents the current generating circuit 59 from being supplied with the current control signal Sa itself which has a drastic variation of level, circuit elements whose response speed is relatively slow can be employed for the lighting inhibit means 100 and the forced lighting means 96. Thus, it is advantageously possible to provide the whole of the laser protecting means at reduced costs.

Further, connection of the low-pass filter 94 to the output side of the D/A converter 58 makes it difficult for a surge current to flow through the laser 31, and this prevents deterioration of the laser 31.

Accordingly, the present invention may be applied to a simple type color reproducing machine or to a laser printer as described above.

What is claimed is:

1. A semiconductor laser device comprising:
    a semiconductor laser;
    a light quantity monitor circuit for monitoring the quantity of light emitted from said semiconductor laser, and for outputting a signal corresponding to the quantity of light emitted from said laser;
    A/D converting means for converting said signal output from said light quantity monitor circuit into a digital quantity and for providing a digital output;
    control means for controlling said digital quantity so that said digital output of said A/D converting means is within a predetermined range;
    D/A converting means for converting the output of said control means into an analog signal;
    current generating means for supplying said semiconductor laser with a predetermined driving current in accordance with said analog signal; and
    means for comparing the quantity of light emitted from said laser with a predetermined value;
    said control means comprising means for selecting either an increment or a decrement of the quantity of light, wherein the increment or the decrement of said digital quantity is selected in such a manner that, when the output of said light quantity monitor circuit is below a predetermined light quantity, A is selected, whereas, when said output is above said predetermined light quantity, B is selected said A and B being set so as to satisfy the following condition:

A>B wherein each of A and B is an increment or decrement of said digital quantity.

2. A semiconductor laser device comprising:
    a semiconductor laser;
    a light quantity monitor circuit for monitoring the quantity of light emitted from said semiconductor laser, and for outputting a voltage corresponding to the quantity of light emitted from said laser;

A/D converting means for converting said voltage output from said light quantity monitor circuit into a digital quantity;

control means for controlling a digital a digital quantity which is to be given to D/A converting means in accordance with the output of said A/D converting means; and current generating means for supplying said semiconductor laser with a predetermined driving current in accordance with an analog signal obtained from said D/A converting means;

said light quantity monitor circuit comprising current-to-voltage converting means for producing a voltage which is a function of the quantity of light emitted from said semiconductor laser; and first voltage adjusting means for obtaining a voltage which is a preselected function of the output of said current-to-voltage converting means.

3. A semiconductor layer device according to claim 2, wherein said control means comprises a microcomputer for controlling the digital quantity which is to be given to said D/A converting means such that the output value of said A/D converting means is within a predetermined range.

4. A semiconductor laser device according to claim 2, further comprising a second voltage adjusting means coupled to the output of said first voltage adjusting means for adjusting said first voltage to compensate for reduced light sensed with said light quantity monitor.

5. A semiconductor laser device according to claim 2, wherein said voltage adjusting means comprises a resistance-type potential divider circuit whose potential division ratio is adjustable.

6. A semiconductor laser device according to claim 2, wherein said voltage adjusting means comprises an operational amplifier whose amplification factor is adjustable.

7. A semiconductor laser device according to claim 3, wherein said voltage adjusting means comprises a resistance-type potential divider circuit whose potential division ratio is adjustable.

8. A semiconductor laser device according to claim 3, wherein said voltage adjusting means comprises an operational amplifier whose amplification factor is adjustable.

9. A semiconductor laser device comprising:

a semiconductor laser;

a light quantity monitor circuit for monitoring the quantity of light emitted from said semiconductor laser;

A/D converting means for converting a voltage output from said light quantity monitor circuit into a digital quantity;

D/A converting means for converting said digital quantity into an analog signal;

current generating means for supplying said semiconductor laser with a predetermined driving current in accordance with said analog signal;

a microcomputer for controlling said digital quantity which is to be given to said D/A converting means so that the output of said A/D converting means is maintained within a predetermined range;

forced lighting means for turning on said semiconductor laser for a predetermined period of time when the output of said D/A converting means is detected having changed in one direction; and lighting inhibit means for inhibiting lighting of said semiconductor laser when the voltage output from said light quantity monitor circuit is detected exceeding a predetermined value.

10. A semiconductor laser device according to claim 9, wherein said forced lighting means comprises edge detecting means for detecting a rise of the output of said D/A converting means, and a pulse generating section for generating a forced lighting signal for a predetermined period of time from the time at which the output of said D/A converting means is detected.

11. A semiconductor laser device according to claim 9, wherein said lighting inhibit means comprises a comparator circuit for making comparison between a voltage output from said light quantity monitor circuit and a reference voltage, and a pulse generating section for generating a predetermined pulse when the output of said comparator circuit changes.

12. A semiconductor laser device according to claim 9, wherein input control means is provided at the input side of said current generating means, said input control means being supplied with at least said forced lighting signal, a lighting inhibit signal and a laser modulation signal which corresponds to an image signal.

13. A semiconductor laser device comprising:

a semiconductor laser;

a light quantity monitor circuit for monitoring the quantity of light emitted from said semiconductor laser;

A/D converting means for converting a voltage output from said light quantity monitor circuit into a digital quantity;

D/A converting means for converting said digital quantity into an analog signal;

current generating means for supplying said semiconductor laser with a predetermined driving current in accordance with said analog signal;

a microcomputer for controlling said digital quantity which is to be given to said D/A converting means so that the output of said A/D converting means is maintained within a predetermined range;

a low-pass filter for filtering a current control signal obtained from said D/A converting means and supplying the filtered signal to said current generating circuit;

forced lighting means for turning on said semiconductor laser for a predetermined period of time when the output of said D/A converting means is detected having changed in one direction; and lighting inhibit means for inhibiting lighting of said semiconductor laser when the voltage output from said light quantity monitor circuit is detected exceeding a predetermined value.

14. A semiconductor laser device according to claim 13, said forced lighting means comprises edge detecting means for detecting a rise of the output of said D/A converting means, and a pulse generating section for generating a forced lighting signal for a predetermined period of time from the time at which the output of said D/A converting means is detected.

15. A semiconductor laser device according to claim 13, wherein said lighting inhibit means comprises a comparator circuit for making comparison between a voltage output from said light quantity monitor circuit and a reference voltage, and a pulse generating section for generating a predetermined pulse when the output of said comparator circuit changes.

16. A semiconductor laser device according to claim 13, wherein input control means is provided at the input side of said current generating means, said input control means being supplied with at least said forced lighting signal, a lighting inhibit signal and a laser modulation signal which corresponds to an image signal.

17. A semiconductor laser device according to claim 13, wherein said low-pass filter is constituted by an RC time constant circuit.

* * * * *